(12) United States Patent
Liu et al.

(10) Patent No.: US 11,769,861 B2
(45) Date of Patent: Sep. 26, 2023

(54) LIGHT-EMITTING DIODE PACKAGING STRUCTURE AND METHOD FOR FABRICATING THE SAME

(71) Applicant: INGENTEC CORPORATION, Miaoli County (TW)

(72) Inventors: Ai Sen Liu, Miaoli County (TW); Hsiang An Feng, Miaoli County (TW); Cheng Yu Chung, Miaoli County (TW); Chia Wei Tu, Miaoli County (TW); Ya Li Chen, Miaoli County (TW)

(73) Assignee: Ingentec Corporation, Miaoli County (TW)

( * ) Notice: Subject to any disclaimer, the term of this patent is extended or adjusted under 35 U.S.C. 154(b) by 289 days.

(21) Appl. No.: 17/240,055

(22) Filed: Apr. 26, 2021

(65) Prior Publication Data
US 2022/0271200 A1    Aug. 25, 2022

(30) Foreign Application Priority Data

Feb. 23, 2021 (TW) .................. 110106374

(51) Int. Cl.
*H01L 33/38* (2010.01)
*H01L 33/00* (2010.01)
*H01L 33/62* (2010.01)

(52) U.S. Cl.
CPC .......... *H01L 33/382* (2013.01); *H01L 33/005* (2013.01); *H01L 33/62* (2013.01)

(58) Field of Classification Search
CPC ..... H01L 33/382; H01L 33/005; H01L 33/62; H01L 33/486; H01L 25/0753; H01L 33/48; H01L 2933/0033; H01L 2933/0066
See application file for complete search history.

(56) References Cited

U.S. PATENT DOCUMENTS

| | | | | |
|---|---|---|---|---|
| 2006/0261357 | A1* | 11/2006 | Tsou | H01L 33/641 257/E25.02 |
| 2007/0291489 | A1* | 12/2007 | Baroky | F21K 9/00 362/294 |
| 2013/0322081 | A1* | 12/2013 | Pan | H01L 27/156 362/249.02 |

* cited by examiner

*Primary Examiner* — Su C Kim
(74) *Attorney, Agent, or Firm* — Rosenberg, Klein & Lee (57) ABSTRACT

A light-emitting diode packaging structure and a method for fabricating the same is disclosed. A semiconductor wafer is provided, which includes semiconductor substrates. Each semiconductor substrate is penetrated with a first through hole and three second through holes. An insulation layer is formed on the surface of each semiconductor substrate and the inner surfaces of the first through hole, the first sub-through hole, and the second sub-through hole. A patterned electrode layer is formed on the top surface of the semiconductor substrate. A conductive material covering the insulation layer is formed in the first through hole and the second through hole and electrically connected to the patterned electrode layer. Three light-emitting diodes are respectively formed in the first sub-through holes of the second through holes of each semiconductor substrate and respectively electrically connected to the conductive material within the second through holes.

8 Claims, 14 Drawing Sheets

LIGHT-EMITTING DIODE PACKAGING STRUCTURE AND METHOD FOR FABRICATING THE SAME

BACKGROUND OF THE INVENTION

This application claims priority of Application No. 110106374 filed in Taiwan on 23 Feb. 2021 under 35 U.S.C. § 119; the entire contents of all of which are hereby incorporated by reference.

FIELD OF THE INVENTION

The present invention relates to the packaging technology, particularly to a light-emitting diode packaging structure and a method for fabricating the same.

DESCRIPTION OF THE RELATED ART

Light-emitting diodes (LEDs), made of semiconductor materials, emit light with various colors, such as red right, green light, yellow light, and blue right. When a forward voltage is applied to the P-N junction of the semiconductor material, the light-emitting diode emits light. LEDs have advantages of low power consumption, high brightness, low voltage, easy matching with integrated circuits, easy driving, and long service life. Therefore, they have been widely used in lighting devices and various industries.

Figure 1:
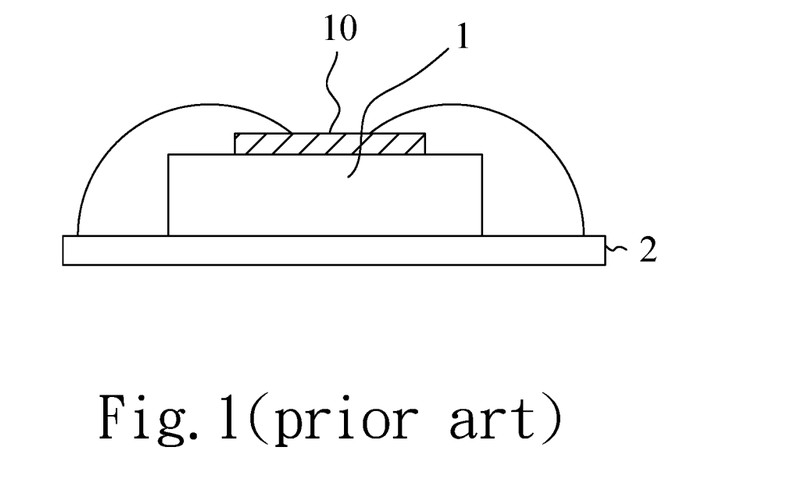
FIG. 1 is a schematic diagram illustrating a light-emitting diode and a package substrate in the conventional technology.

In the method of packaging a LED, the electrodes of the LED is connected to a package substrate by wire bonding. As illustrated in FIG. 1, the top electrode 10 of the LED 1 is electrically connected to a package substrate 2 through soldering wires. Since multiple light-emitting diodes need to be wire-bonded one by one, the production speed and yield cannot be satisfied in the application of multiple chips. Due to wire bonding, the structure for packaging LEDs is difficultly reduced in volume and impedance. It is difficult for the structure to meet the needs of light, thin, small and high-brightness applications.

To overcome the abovementioned problems, the present invention provides a light-emitting diode packaging structure and a method for fabricating the same, so as to solve the afore-mentioned problems of the prior art.

SUMMARY OF THE INVENTION

The present invention provides a light-emitting diode packaging structure and a method for fabricating the same, which improves the yield and simplify the structure.

In an embodiment of the present invention, a light-emitting diode packaging structure includes a semiconductor substrate, an insulation layer, a first patterned electrode layer, a second patterned electrode layer, and three light-emitting diodes. The semiconductor substrate is penetrated with a first through hole and three second through holes. Each of the second through holes includes a first sub-through hole and a second sub-through hole communicating with the first sub-through hole. The first sub-through hole and the second sub-through hole are respectively formed close to the top surface and the bottom surface of the semiconductor substrate. The cross-sectional area of the first sub-through hole is larger than the cross-sectional area of the second sub-through hole. The insulation layer is formed on the surface of the semiconductor substrate and the inner surfaces of the first through hole, the first sub-through hole, and the second sub-through hole. The first through hole and the second sub-through hole are filled with a conductive material that covers the insulation layer. The first patterned electrode layer is formed on the top surface of the semiconductor substrate and electrically connected to the conductive material. The second patterned electrode layer is formed on the bottom surface of the semiconductor substrate and electrically connected to the conductive material within the first through hole and the second sub-through holes. The light-emitting diodes are respectively formed in the first sub-through holes of the second through holes and respectively electrically connected to the conductive material within the second sub-through holes.

In an embodiment of the present invention, the light-emitting diode packaging structure further includes a plurality of conductive pads formed on the second patterned electrode layer and electrically connected to the second patterned electrode layer.

In an embodiment of the present invention, each of the light-emitting diodes includes a metal combined substrate, an epitaxial electrode layer, an electrode unit, and a transparent conductive layer. The metal combined substrate includes a first metal layer and two second metal layers. The second metal layers are respectively formed on the top surface and the bottom surface of the first metal layer. The first metal layer includes a nickel-iron alloy. The second metal layers include copper. The ratio of the second metal layer to the first metal layer to the second metal layer of the metal combined substrate in thickness is 1:2.5~3.5:1. The metal combined substrate is formed in the first sub-through hole. The epitaxial electrode layer is formed on the metal combined substrate and formed in the first sub-through hole. The electrode unit is formed on the epitaxial electrode layer and formed in the first sub-through hole. The transparent conductive layer, covering the metal combined substrate, the conductive material, the epitaxial electrode layer, the electrode unit, and the first patterned electrode layer, is electrically connected to the conductive material, the electrode unit, and the first patterned electrode layer.

In an embodiment of the present invention, the light-emitting diodes include a red light-emitting diode, a green light-emitting diode, and a blue light-emitting diode.

In an embodiment of the present invention, the conductive material includes a silver glue.

In an embodiment of the present invention, the first patterned electrode layer and the second patterned electrode layer include conductive ink.

In an embodiment of the present invention, a method for fabricating a light-emitting diode packaging structure includes: providing a semiconductor wafer, wherein the semiconductor wafer includes a plurality of semiconductor substrates; penetrating through each of the plurality of semiconductor substrates to form a first through hole and three second through holes, wherein each of the second through holes includes a first sub-through hole and a second sub-through hole communicating with the first sub-through hole, the first sub-through hole and the second sub-through hole are respectively formed close to the top surface and the bottom surface of the semiconductor substrate, and the cross-sectional area of the first sub-through hole is larger than the cross-sectional area of the second sub-through hole; forming an insulation layer on the surface of each of the plurality of semiconductor substrates and the inner surfaces of the first through hole, the first sub-through hole, and the second sub-through hole; forming a first patterned electrode layer on the top surface of the semiconductor substrate; forming a conductive material that covers the insulation layer in the first through hole and the second sub-through hole and electrically connecting the conductive material to the first patterned electrode layer; forming a second patterned electrode layer on the bottom surface of the semiconductor substrate and electrically connecting the second patterned electrode layer to the conductive material within the first through hole and the second sub-through holes; respectively forming three light-emitting diodes in the first sub-through holes of the second through holes of each of the plurality of semiconductor substrates and respectively electrically connecting the light-emitting diodes to the conductive material within the second sub-through holes; and separating from the plurality of semiconductor substrates.

In an embodiment of the present invention, the method for fabricating a light-emitting diode packaging structure further includes a step of forming a plurality of conductive pads on the second patterned electrode layer and electrically connecting the plurality of conductive pads to the second patterned electrode layer.

To sum up, the light-emitting diode packaging structure and the method for fabricating the same use the through-silicon via (TSV) technology to improve the yield and simplify the structure.

Below, the embodiments are described in detail in cooperation with the drawings to make easily understood the technical contents, characteristics and accomplishments of the present invention.

DETAILED DESCRIPTION OF THE INVENTION

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Throughout the description and claims, it will be understood that when a component is referred to as being "positioned on," "positioned above," "connected to," "engaged with," or "coupled with" another component, it can be directly on, directly connected to, or directly engaged with the other component, or intervening component may be present. In contrast, when a component is referred to as being "directly on," "directly connected to," or "directly engaged with" another component, there are no intervening components present.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Unless otherwise specified, some conditional sentences or words, such as "can", "could", "might", or "may", usually attempt to express that the embodiment in the present invention has, but it can also be interpreted as a feature, element, or step that may not be needed. In other embodiments, these features, elements, or steps may not be required.

Figure 2:
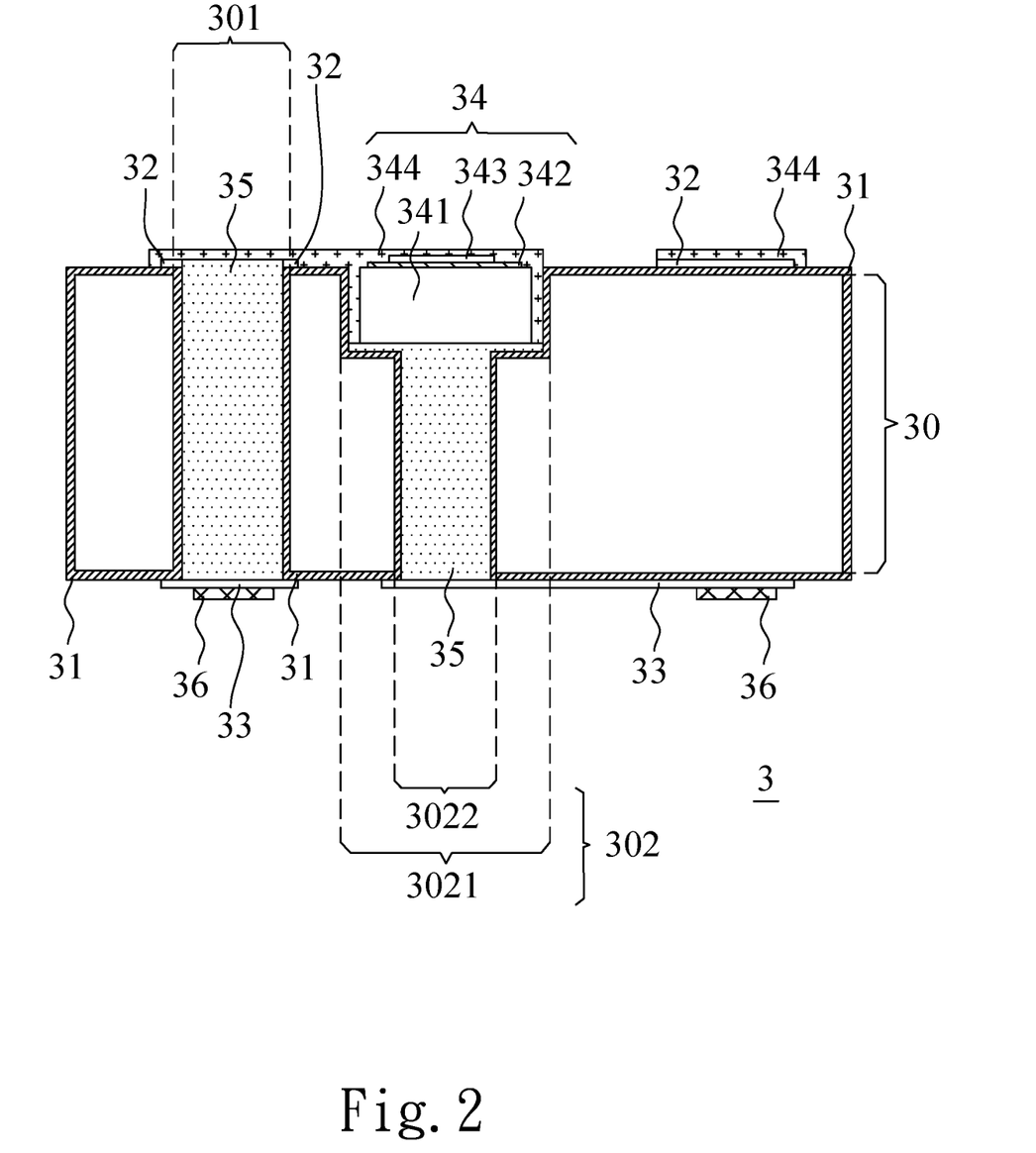
FIG. 2 is a cross-sectional view of a light-emitting diode packaging structure according to an embodiment of the present invention.

FIG. 2 is a cross-sectional view of a light-emitting diode packaging structure according to an embodiment of the present invention. Referring to FIG. 2, the light-emitting diode packaging structure 3 includes a semiconductor substrate 30, an insulation layer 31, a first patterned electrode layer 32, a second patterned electrode layer 33, three light-emitting diodes 34, and a conductive material 35. The first patterned electrode layer 32 and the second patterned electrode layer 33 include conductive ink, but the present invention is not limited thereto. The conductive material 35 includes, but not limited to, a silver glue. The light-emitting diodes 34 include a red light-emitting diode, a green light-emitting diode, and a blue light-emitting diode. The semiconductor substrate 30 is penetrated with a first through hole 301 and three second through holes 302. Each of the second through holes 302 includes a first sub-through hole 3021 and a second sub-through hole 3022 communicating with the first sub-through hole 3021. The first sub-through hole 3021 and the second sub-through hole 3022 are respectively formed close to the top surface and the bottom surface of the semiconductor substrate 30. The cross-sectional area of the first sub-through hole 3021 is larger than the cross-sectional area of the second sub-through hole 3022. The insulation layer 31 is formed on the surface of the semiconductor substrate 30 and the inner surfaces of the first through hole 301, the first sub-through hole 3021, and the second sub-through hole 3022. The first through hole 301 and the second sub-through hole 3022 are filled with the conductive material 35 that covers the insulation layer 31. The first patterned electrode layer 32 is formed on the top surface of the semiconductor substrate 30 and electrically connected to the conductive material 35. The second patterned electrode layer 33 is formed on the bottom surface of the semiconductor substrate 30 and electrically connected to the conductive material 35 within the first through hole 301 and the second sub-through holes 302. The light-emitting diodes 34 are respectively formed in the first sub-through holes 3021 of the second through holes 302 and respectively electrically connected to the conductive material 35 within the second sub-through holes 3022. In addition, the light-emitting diode packaging structure 3 may further include a plurality of conductive pads 36 formed on the second patterned electrode layer 33 and electrically connected to the second patterned electrode layer 33. Assume that the semiconductor substrate 30 is implemented with a silicon substrate. Thus, the first through hole 301 and the second sub-through holes 302 are implemented with silicon through holes. Compared with the wire bonding technology, the light-emitting diode packaging structure 3 uses the through-silicon via (TSV) technology to improve the yield and simplify the structure.

In some embodiments of the present invention, each of the light-emitting diodes 34 may include a metal combined substrate 341, an epitaxial electrode layer 342, an electrode unit 343, and a transparent conductive layer 344. The metal combined substrate 341 a first metal layer and two second metal layers. The second metal layers are respectively formed on the top surface and the bottom surface of the first metal layer. The first metal layer includes a nickel-iron alloy. The second metal layers include copper. The nickel-iron alloy is Invar. The ratio of the second metal layer to the first metal layer to the second metal layer of the metal combined substrate 341 in thickness is 1:2.5~3.5:1. The metal combined substrate 341 is formed in the first sub-through hole 3021. The metal combined substrate 341 has a high coefficient of thermal conductivity, a low coefficient of thermal expansion, and initial magnetic permeability. The epitaxial electrode layer 342 is formed on the metal combined substrate 341 and formed in the first sub-through hole 3021. The electrode unit 343 is formed on the epitaxial electrode layer 342 and formed in the first sub-through hole 3021. The transparent conductive layer 344, covering the metal combined substrate 341, the conductive material 35, the epitaxial electrode layer 342, the electrode unit 343, and the first patterned electrode layer 32, is electrically connected to the conductive material 35, the electrode unit 343, and the first patterned electrode layer 32.

Figure 3A:
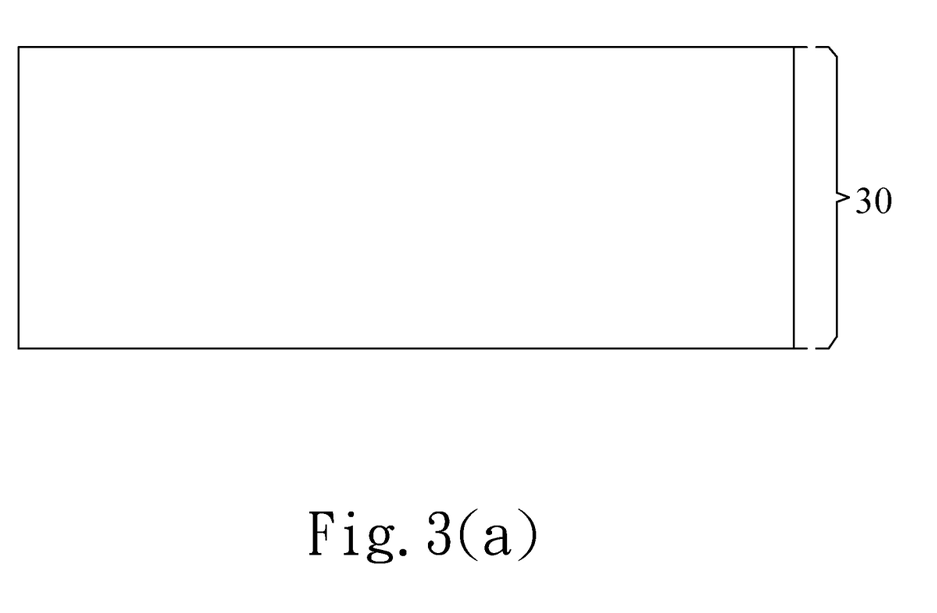
FIGS. 3(a)-3(h) are schematic diagrams illustrating the step of fabricating a light-emitting diode packaging structure according to an embodiment of the present invention.
Figure 3B:
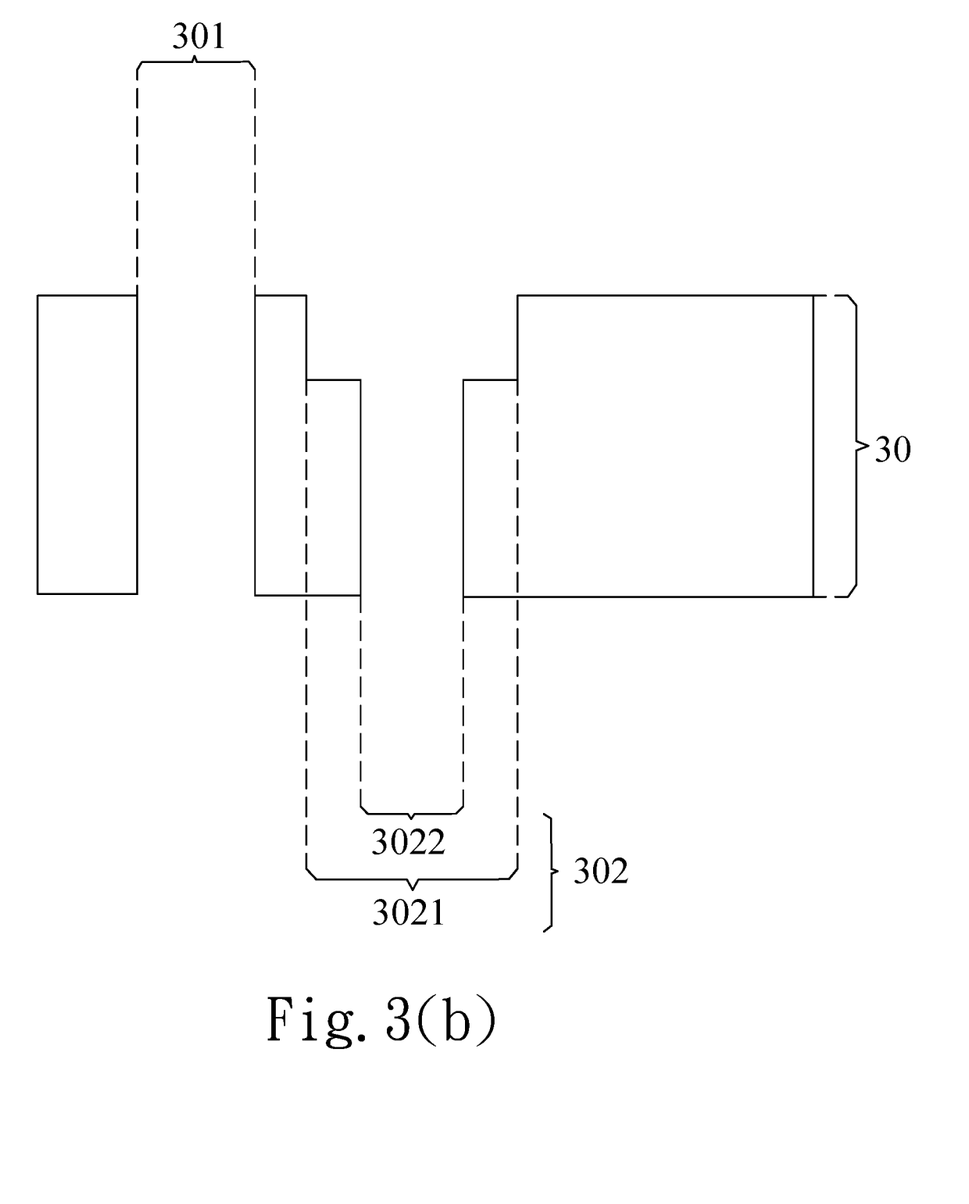
Figure 3C:
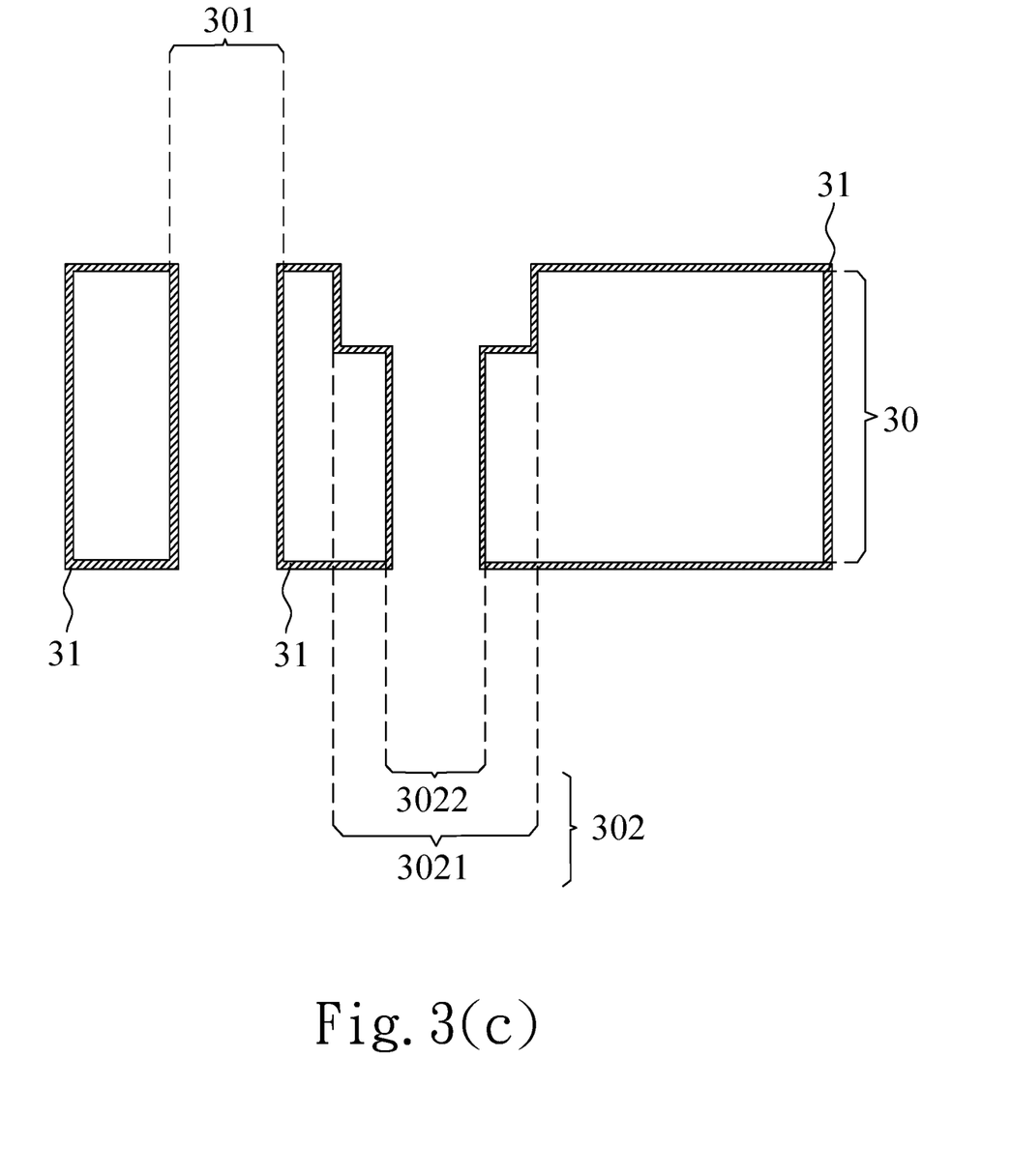
Figure 3D:
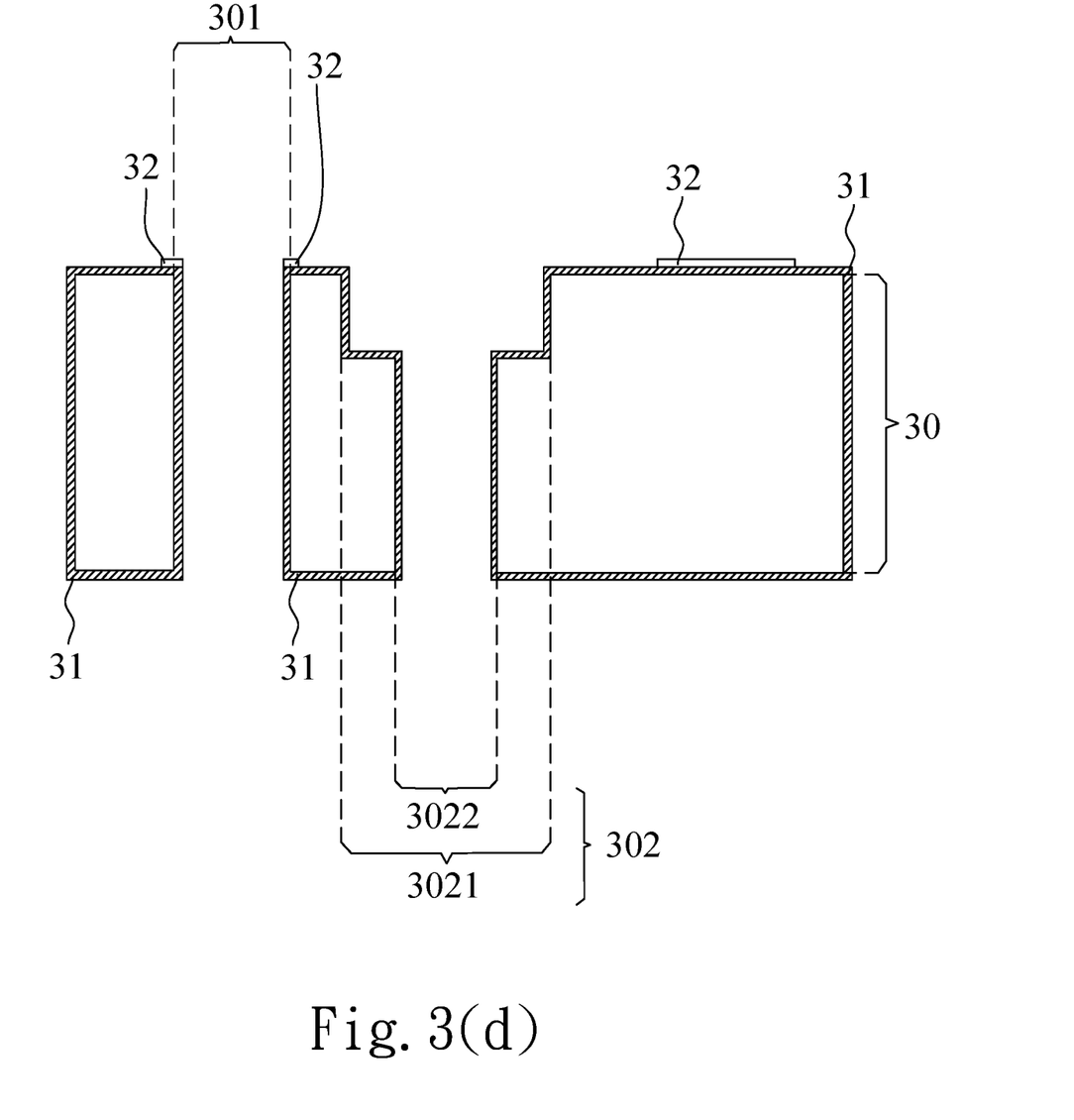
Figure 3E:
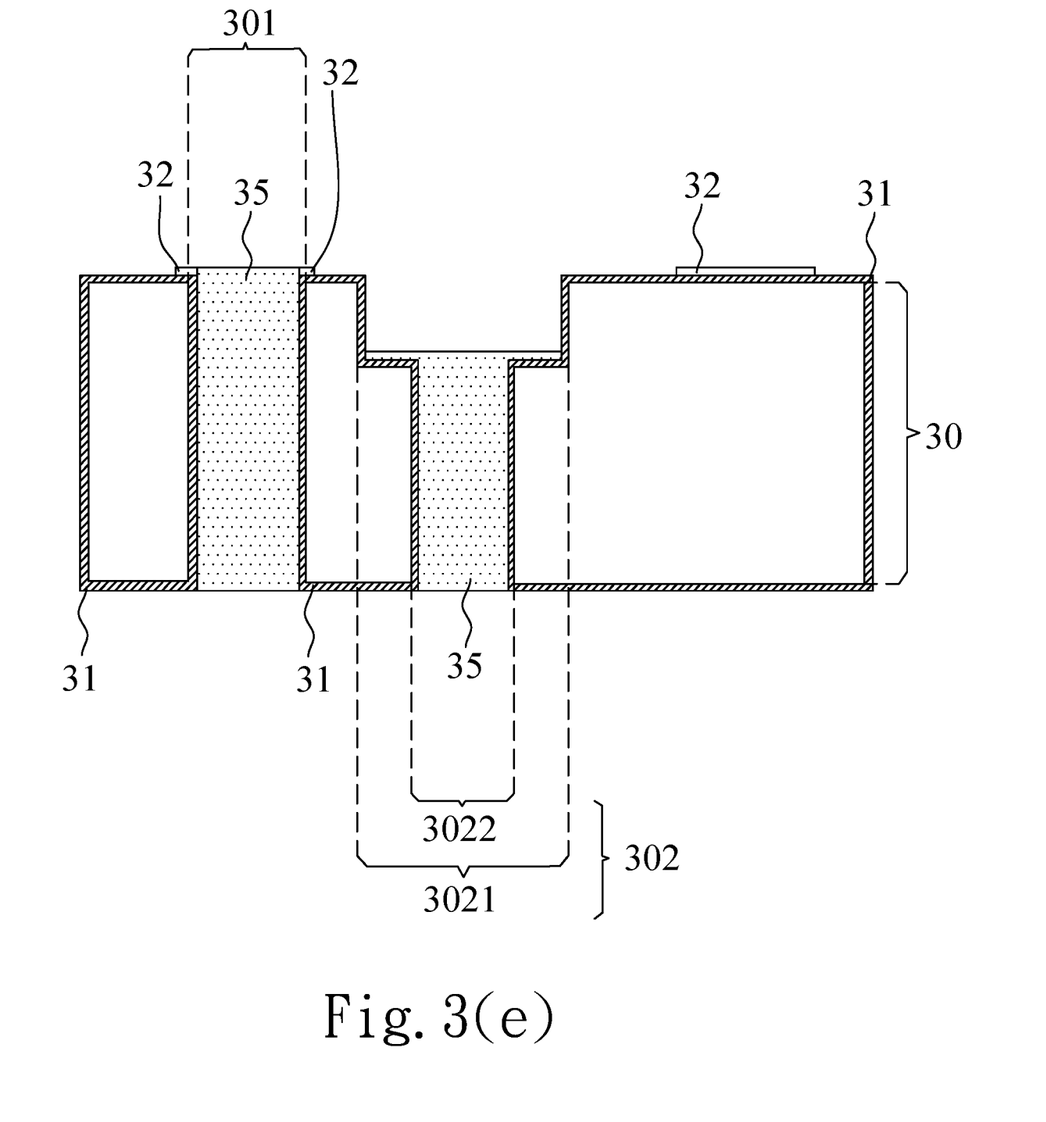
Figure 3F:
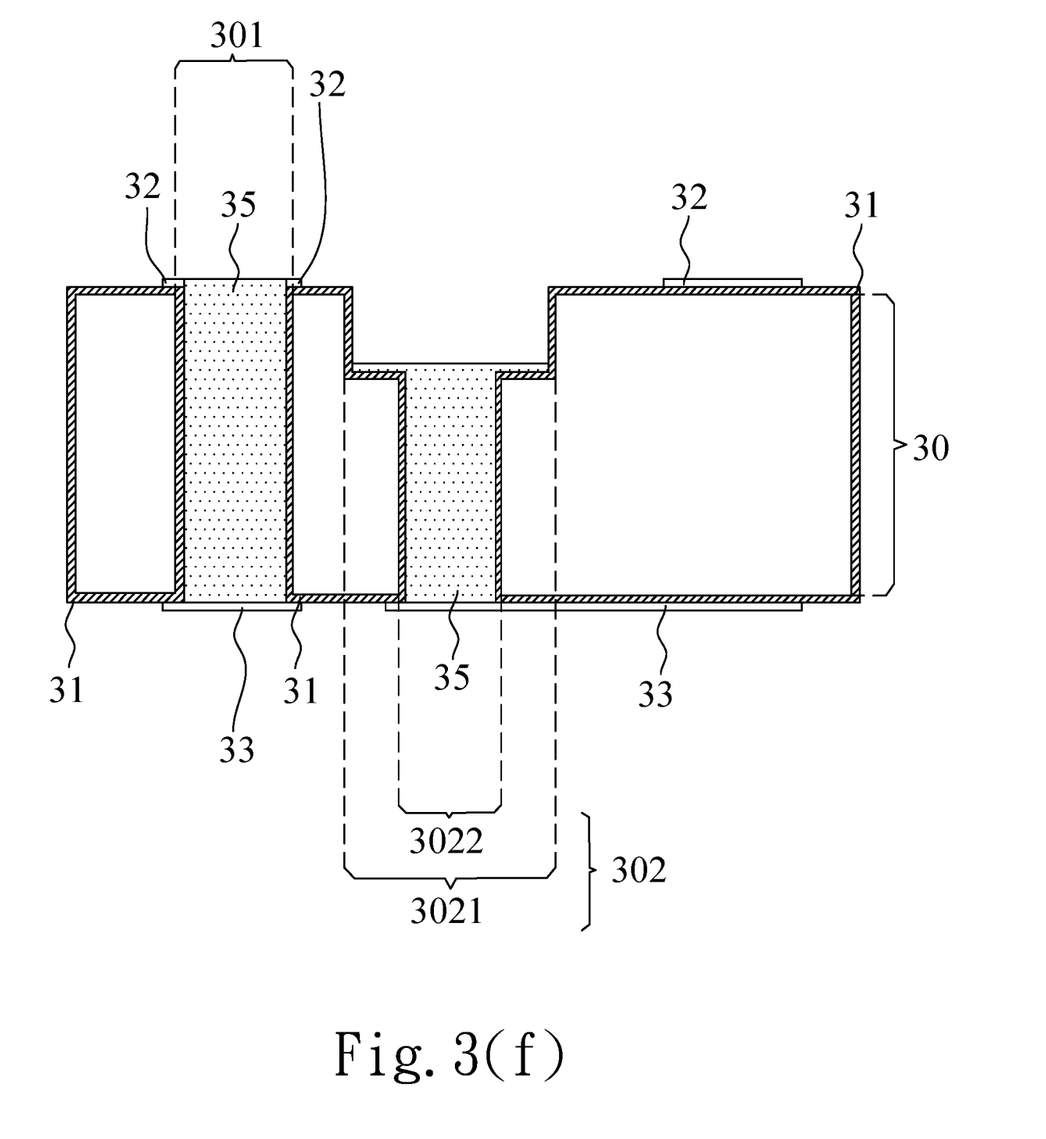
Figure 3G:
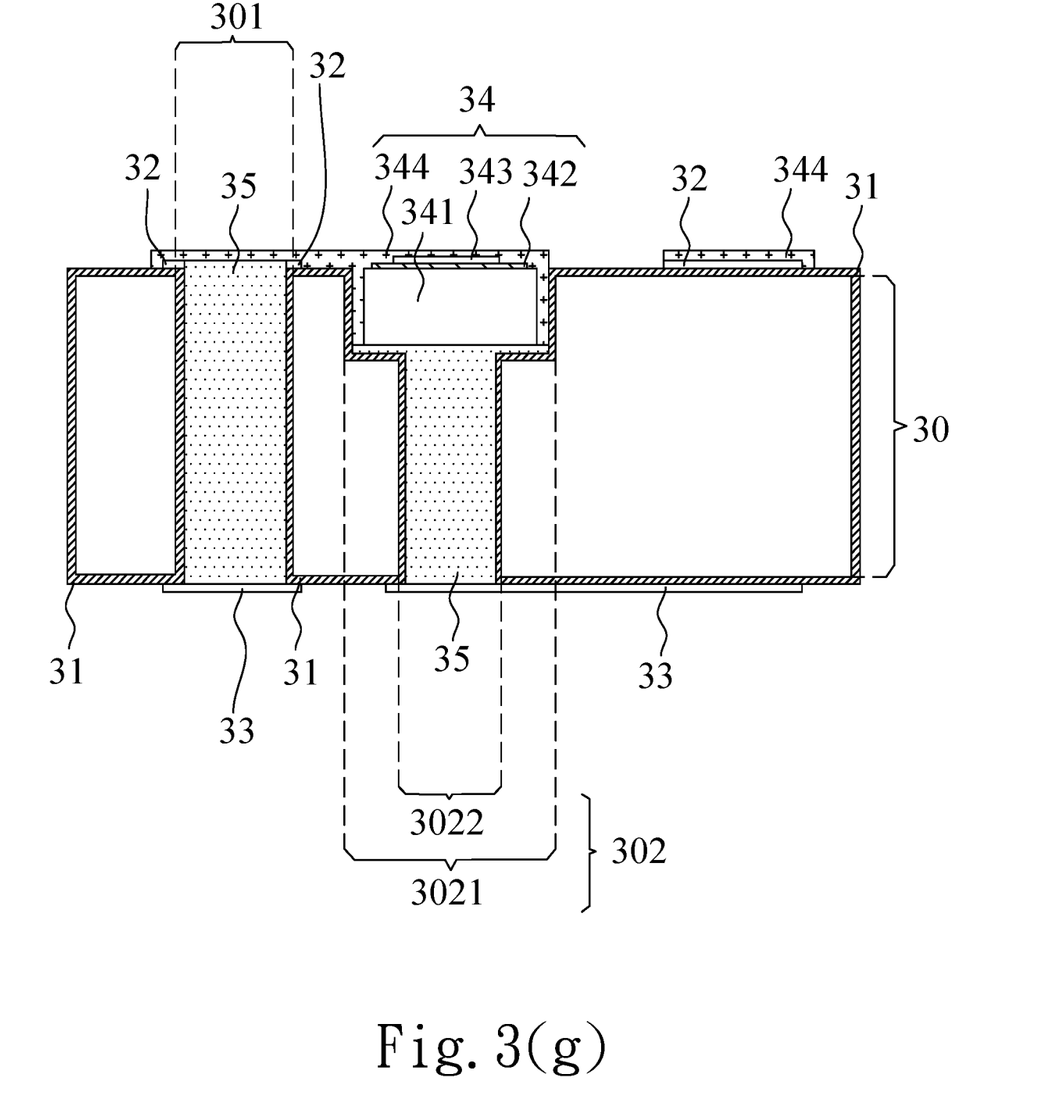
Figure 3H:
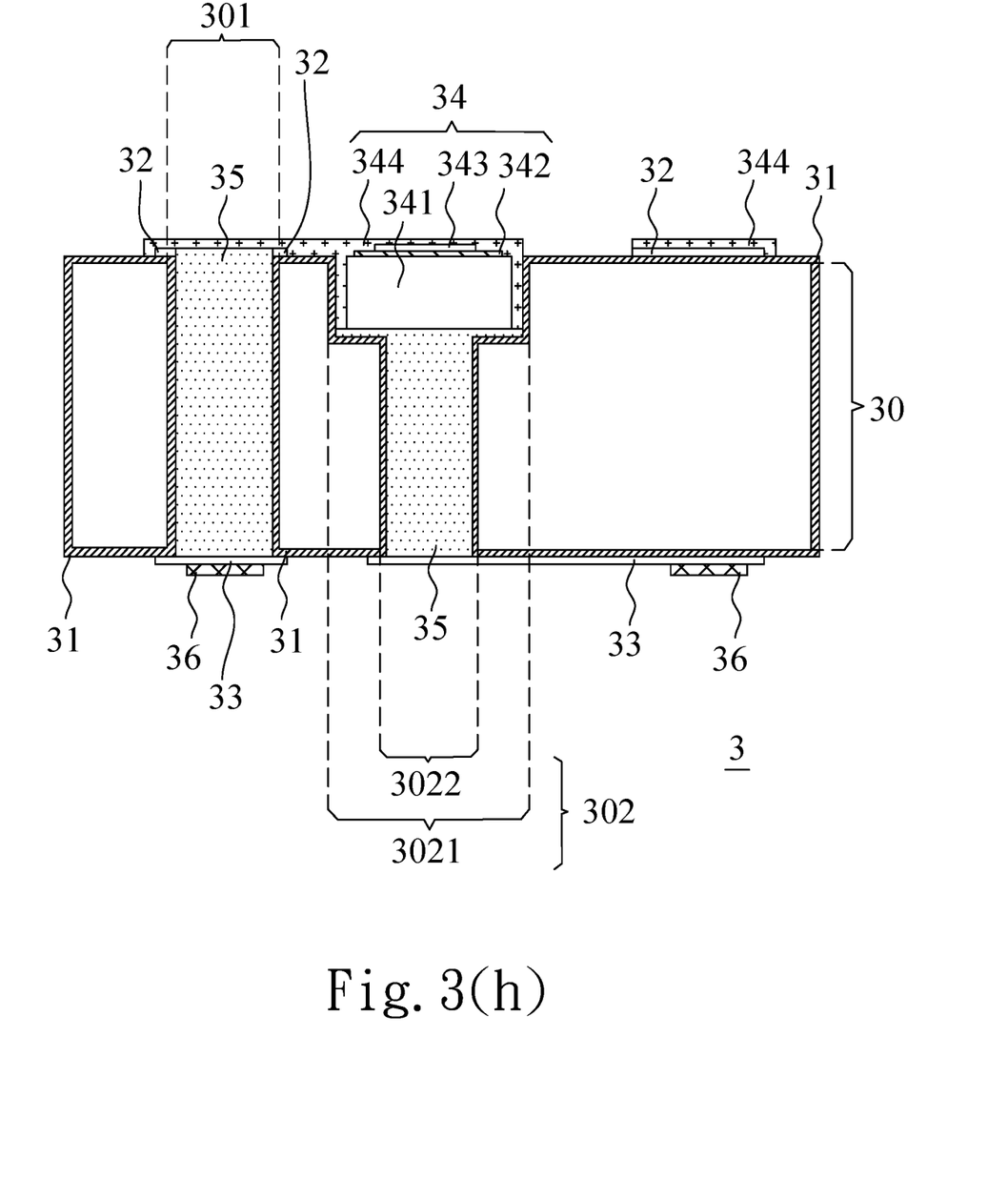
Figure 4:
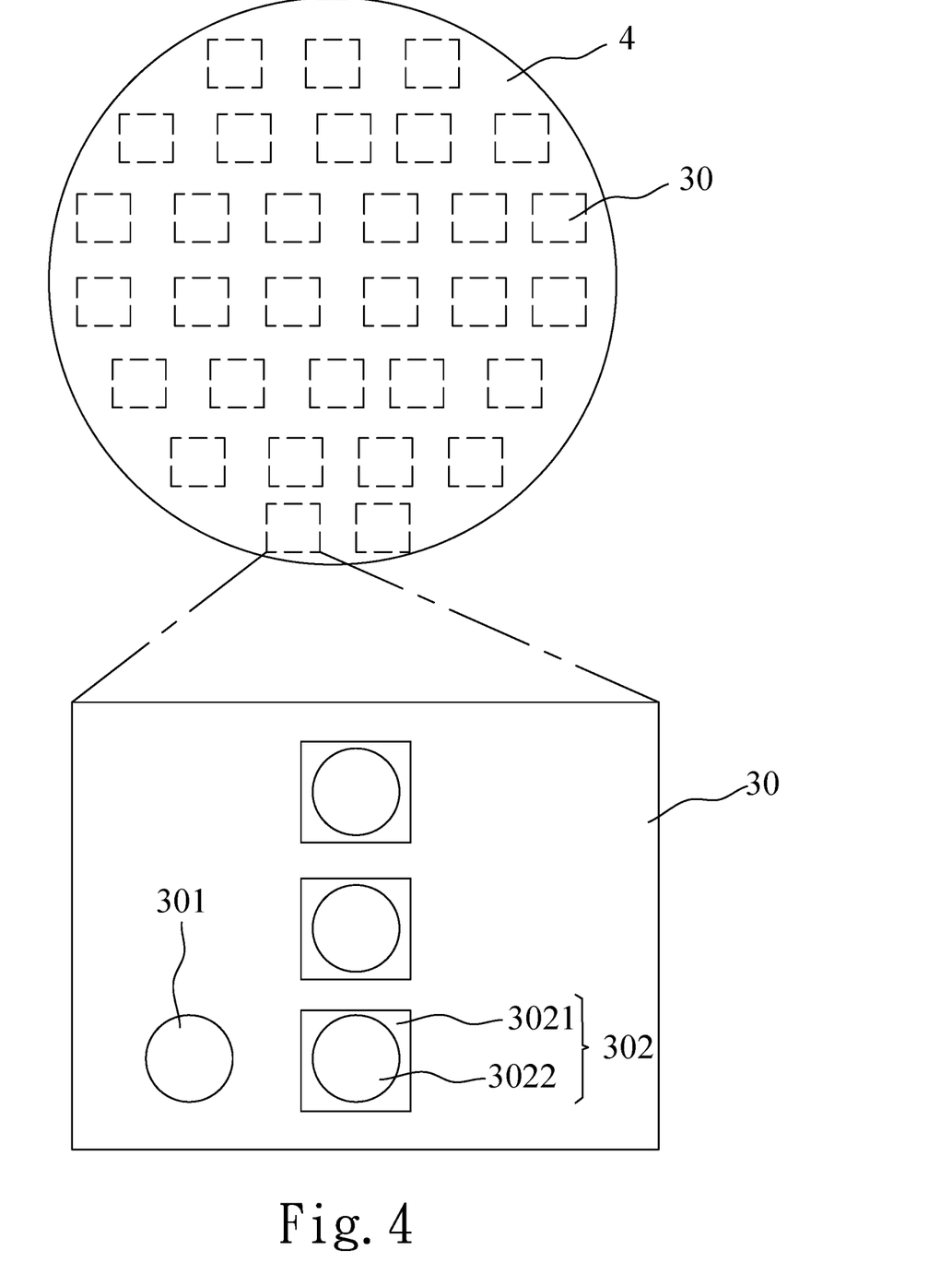
FIG. 4 is a top view corresponding to FIG. 3 (b)
Figure 5:
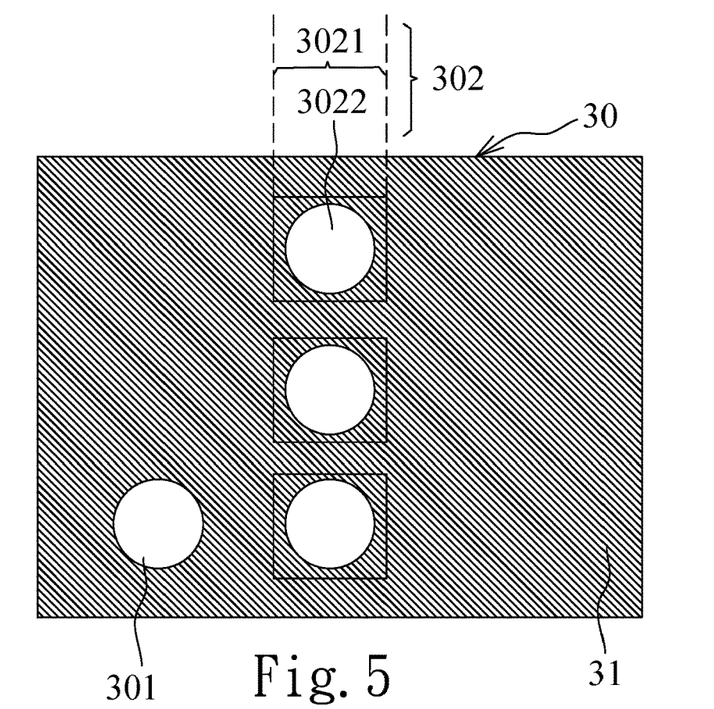
FIG. 5 is a top view corresponding to FIG. 3 (c)
Figure 6:
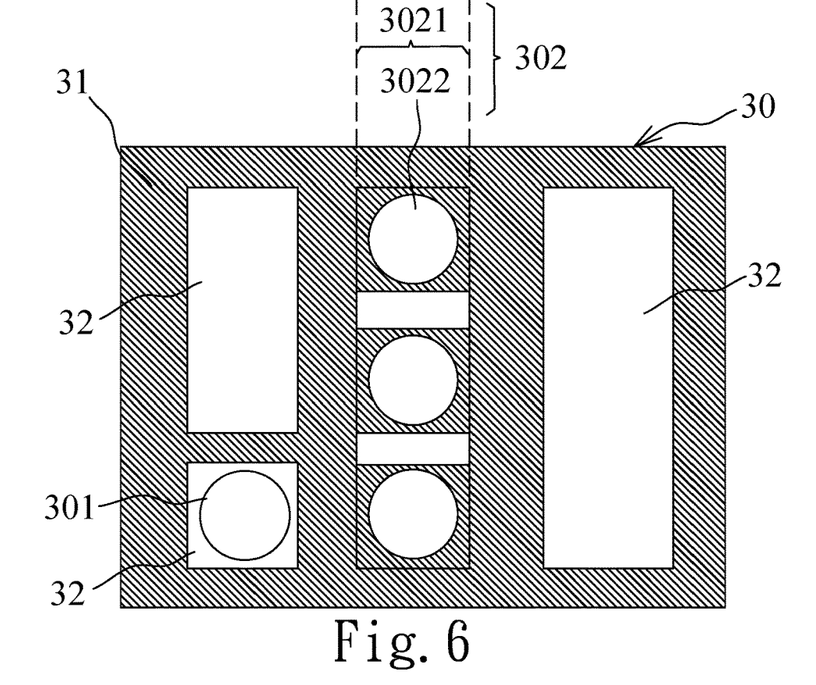
FIG. 6 is a top view corresponding to FIG. 3 (d)
Figure 7:
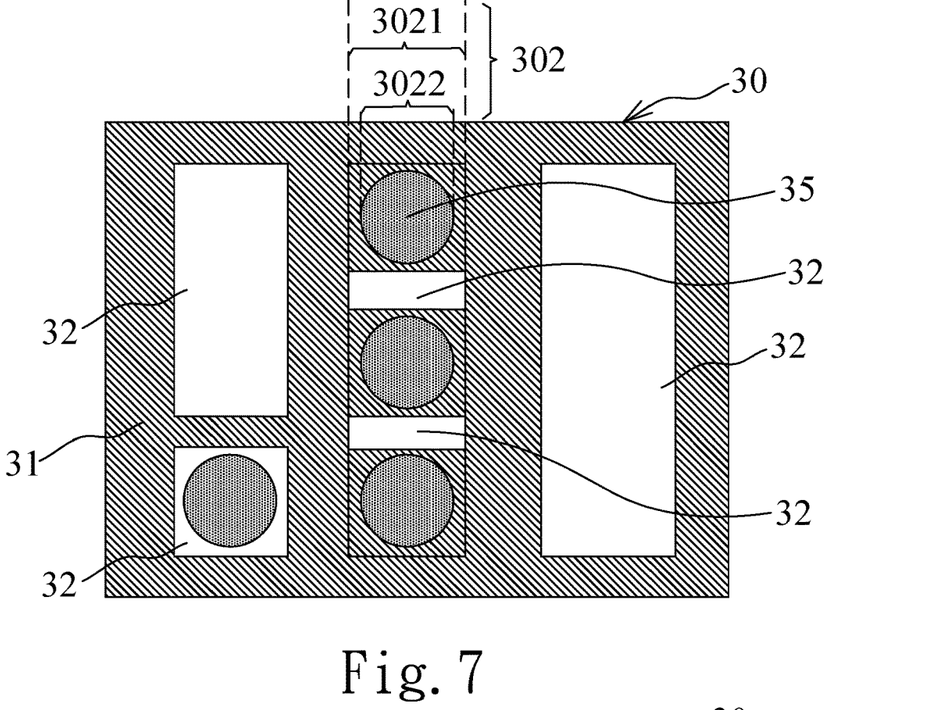
FIG. 7 is a top view corresponding to FIG. 3 (e)
Figure 8:
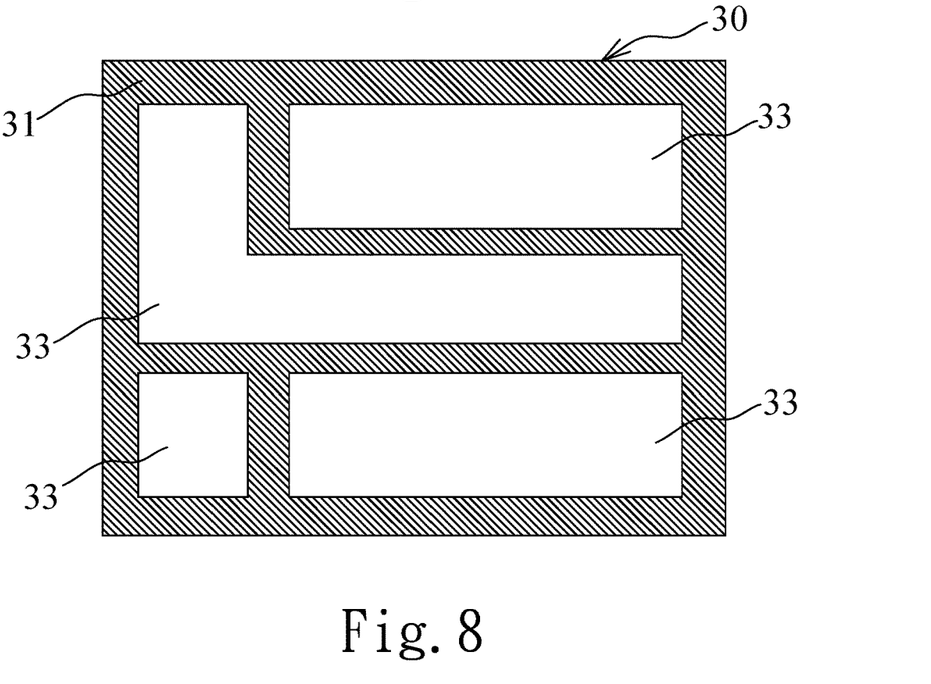
FIG. 8 is a bottom view corresponding to FIG. 3 (f)
Figure 9:
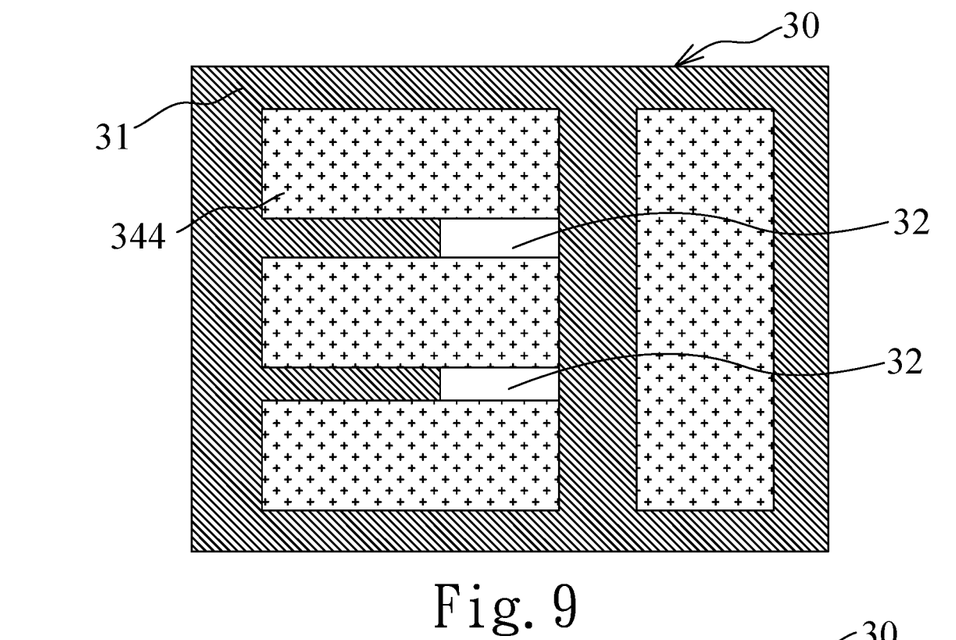
FIG. 9 is a top view corresponding to FIG. 3 (g)
Figure 10:
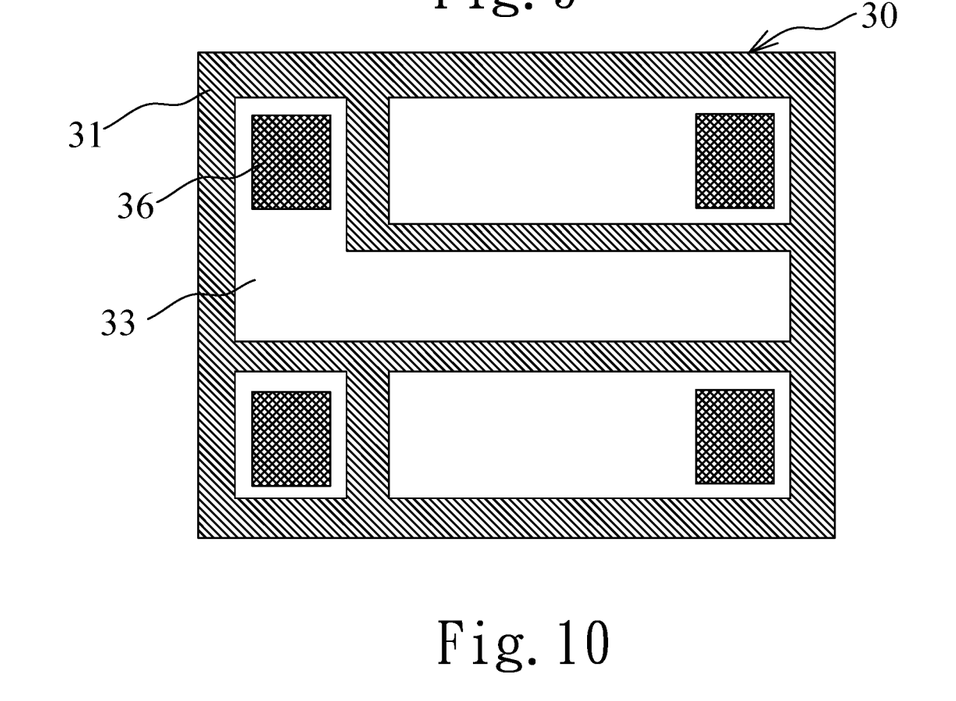
FIG. 10 is a bottom view corresponding to FIG. 3 (h).

FIGS. 3(a)-3(h) are schematic diagrams illustrating the step of fabricating a light-emitting diode packaging structure according to an embodiment of the present invention. FIG. 4 is a top view corresponding to FIG. 3 (b). FIG. 5 is a top view corresponding to FIG. 3 (c). FIG. 6 is a top view corresponding to FIG. 3 (d). FIG. 7 is a top view corresponding to FIG. 3 (e). FIG. 8 is a bottom view corresponding to FIG. 3 (f). FIG. 9 is a top view corresponding to FIG. 3 (g). FIG. 10 is a bottom view corresponding to FIG. 3 (h). The method for fabricating a light-emitting diode packaging structure 3 is introduced as follows. As illustrated in FIG. 3(a), a semiconductor wafer 4 is provided. The semiconductor wafer 4 includes a plurality of semiconductor substrates 30. As illustrated in FIG. 3(b) and FIG. 4, each of the plurality of semiconductor substrates 30 is penetrated to form a first through hole 301 and three second through holes 302. Each of the second through holes 302 includes a first sub-through hole 3021 and a second sub-through hole 3022 communicating with the first sub-through hole 3021. The first sub-through hole 3021 and the second sub-through hole 3022 are respectively formed close to the top surface and the bottom surface of the semiconductor substrate 30. The cross-sectional area of the first sub-through hole 3021 is larger than the cross-sectional area of the second sub-through hole 3022. As illustrated in FIG. 3(c) and FIG. 5, an insulation layer 31 is formed on the surface of each of the plurality of semiconductor substrates 30 and the inner surfaces of the first through hole 301, the first sub-through hole 3021, and the second sub-through hole 3022. As illustrated in FIG. 3(d) and FIG. 6, a first patterned electrode layer 32 is formed on the top surface of the semiconductor substrate 30. As illustrated in FIG. 3(e) and FIG. 7, a conductive material 35 that covers the insulation layer 31 is formed in the first through hole 301 and the second sub-through hole 3022 and electrically connected to the first patterned electrode layer 32. As illustrated in FIG. 3(f) and FIG. 8, a second patterned electrode layer 33 is formed on the bottom surface of the semiconductor substrate 30 and electrically connected to the conductive material 35 within the first through hole 301 and the second sub-through holes 3022. As illustrated in FIG. 3(g) and FIG. 9, three light-emitting diodes are respectively formed in the first sub-through holes 3021 of the second through holes 3022 of each of the plurality of semiconductor substrates 30 and respectively electrically connected to the conductive material 35 within the second sub-through holes 3022. As illustrated in FIG. 3(h) and FIG. 10, a plurality of conductive pads 36 is formed on the second patterned electrode layer 33 which is formed on each semiconductor substrate 30. The plurality of conductive pads 36 is electrically connected to the second patterned electrode layer 33. Finally, the plurality of semiconductor substrates 30 are separated from each other to obtain a plurality of light-emitting diode packaging structures 3. Provided that substantially the same result is achieved, the steps of the flowchart shown in FIGS. 3(a)-3(h) need not be in the exact order shown and need not be contiguous, that is, other steps can be intermediate.

In addition, the step of FIG. 3(h) can be lacked in the foregoing method to obtain the plurality of light-emitting diode packaging structures 3.

According to the embodiments provided above, the light-emitting diode packaging structure and the method for fabricating the same use the through-silicon via (TSV) technology to improve the yield and simplify the structure.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A light-emitting diode packaging structure comprising:
a semiconductor substrate penetrated with a first through hole and three second through holes, wherein each of the second through holes comprises a first sub-through hole and a second sub-through hole communicating with the first sub-through hole, the first sub-through hole and the second sub-through hole are respectively formed close to a top surface and a bottom surface of the semiconductor substrate, and a cross-sectional area of the first sub-through hole is larger than a cross-sectional area of the second sub-through hole;
an insulation layer formed on a surface of the semiconductor substrate and inner surfaces of the first through hole, the first sub-through hole, and the second sub-through hole, and the first through hole and the second sub-through hole are filled with a conductive material that covers the insulation layer;
a first patterned electrode layer formed on the top surface of the semiconductor substrate and electrically connected to the conductive material;
a second patterned electrode layer formed on the bottom surface of the semiconductor substrate and electrically connected to the conductive material within the first through hole and the second sub-through holes; and
three light-emitting diodes respectively formed in the first sub-through holes of the second through holes and respectively electrically connected to the conductive material within the second sub-through holes;
wherein each of the light-emitting diodes comprises:
a metal combined substrate comprising a first metal layer and two second metal layers, the second metal layers are respectively formed on a top surface and a bottom surface of the first metal layer, the first metal layer comprises a nickel-iron alloy, the second metal layers comprise copper, a ratio of the second metal layer to the first metal layer to the second metal layer of the metal combined substrate in thickness is 1:2.5~3.5:1, and the metal combined substrate is formed in the first sub-through hole;

an epitaxial electrode layer formed on the metal combined substrate and formed in the first sub-through hole;

an electrode unit formed on the epitaxial electrode layer and formed in the first sub-through hole; and a transparent conductive layer, covering the metal combined substrate, the conductive material, the epitaxial electrode layer, the electrode unit, and the first patterned electrode layer, electrically connected to the conductive material, the electrode unit, and the first patterned electrode layer.

2. The light-emitting diode packaging structure according to claim 1, further comprising a plurality of conductive pads formed on the second patterned electrode layer and electrically connected to the second patterned electrode layer.

3. The light-emitting diode packaging structure according to claim 1, wherein the light-emitting diodes comprise a red light-emitting diode, a green light-emitting diode, and a blue light-emitting diode.

4. The light-emitting diode packaging structure according to claim 1, wherein the conductive material comprises a silver glue.

5. The light-emitting diode packaging structure according to claim 1, wherein the first patterned electrode layer and the second patterned electrode layer comprise conductive ink.

6. A method for fabricating a light-emitting diode packaging structure comprising:

providing a semiconductor wafer, wherein the semiconductor wafer comprises a plurality of semiconductor substrates;

penetrating through each of the plurality of semiconductor substrates to form a first through hole and three second through holes, wherein each of the second through holes comprises a first sub-through hole and a second sub-through hole communicating with the first sub-through hole, the first sub-through hole and the second sub-through hole are respectively formed close to a top surface and a bottom surface of the semiconductor substrate, and a cross-sectional area of the first sub-through hole is larger than a cross-sectional area of the second sub-through hole;

forming an insulation layer on a surface of each of the plurality of semiconductor substrates and inner surfaces of the first through hole, the first sub-through hole, and the second sub-through hole;

forming a first patterned electrode layer on the top surface of the semiconductor substrate;

forming a conductive material that covers the insulation layer in the first through hole and the second sub-through hole and electrically connecting the conductive material to the first patterned electrode layer;

forming a second patterned electrode layer on the bottom surface of the semiconductor substrate and electrically connecting the second patterned electrode layer to the conductive material within the first through hole and the second sub-through holes;

respectively forming three light-emitting diodes in the first sub-through holes of the second through holes of each of the plurality of semiconductor substrates and respectively electrically connecting the light-emitting diodes to the conductive material within the second sub-through holes; and separating from the plurality of semiconductor substrates;

each of the light-emitting diodes comprises:

a metal combined substrate comprising a first metal layer and two second metal layers, the second metal layers are respectively formed on a top surface and a bottom surface of the first metal layer, the first metal layer comprises a nickel-iron alloy, the second metal layers comprise copper, a ratio of the second metal layer to the first metal layer to the second metal layer of the metal combined substrate in thickness is 1:2.5~3.5:1, and the metal combined substrate is formed in the first sub-through hole;

an epitaxial electrode layer formed on the metal combined substrate and formed in the first sub-through hole;

an electrode unit formed on the epitaxial electrode layer and formed in the first sub-through hole; and a transparent conductive layer, covering the metal combined substrate, the conductive material, the epitaxial electrode layer, the electrode unit, and the first patterned electrode layer, electrically connected to the conductive material, the electrode unit, and the first patterned electrode layer.

7. The method for fabricating a light-emitting diode packaging structure according to claim 6, further comprising a step of forming a plurality of conductive pads on the second patterned electrode layer and electrically connecting the plurality of conductive pads to the second patterned electrode layer.

8. The method for fabricating a light-emitting diode packaging structure according to claim 6, wherein the light-emitting diodes comprise a red light-emitting diode, a green light-emitting diode, and a blue light-emitting diode.

* * * * *